United States Patent
Bharath et al.

(10) Patent No.: US 10,971,416 B2
(45) Date of Patent: *Apr. 6, 2021

(54) PACKAGE POWER DELIVERY USING PLANE AND SHAPED VIAS

(71) Applicant: Intel Corporation, Santa Clara, CA (US)

(72) Inventors: Krishna Bharath, Chandler, AZ (US); Mathew J. Manusharow, Phoenix, AZ (US); Adel A. Elsherbini, Chandler, AZ (US); Mihir K. Roy, Chandler, AZ (US); Aleksandar Aleksov, Chandler, AZ (US); Yidnekachew S. Mekonnen, Chandler, AZ (US); Javier Soto Gonzalez, Chandler, AZ (US); Feras Eid, Chandler, AZ (US); Suddhasattwa Nad, Chandler, AZ (US); Meizi Jiao, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/526,497

(22) Filed: Jul. 30, 2019

(65) Prior Publication Data

US 2019/0355636 A1  Nov. 21, 2019

Related U.S. Application Data

(63) Continuation of application No. 15/776,755, filed as application No. PCT/US2015/066186 on Dec. 16, 2015, now Pat. No. 10,410,939.

(51) Int. Cl.
*H01L 23/52* (2006.01)
*H01L 23/12* (2006.01)
(Continued)

(52) U.S. Cl.
CPC ............ *H01L 23/12* (2013.01); *H01L 21/486* (2013.01); *H01L 23/48* (2013.01);
(Continued)

(58) Field of Classification Search
CPC . H01L 21/486; H01L 23/12; H01L 23/49838; H01L 23/49822; H01L 23/49827; H01L 23/48
(Continued)

(56) References Cited

U.S. PATENT DOCUMENTS

| 6,022,787 A * | 2/2000 | Ma ...................... H01L 23/5222 |
| | | 257/E23.144 |
| 6,569,757 B1 * | 5/2003 | Weling ................ H01L 23/5225 |
| | | 156/71 |

(Continued)

OTHER PUBLICATIONS

International Search Report and Written Opinion for International Patent Application No. PCT/US2015/066186 dated Aug. 18, 2016, 13 pgs.

(Continued)

*Primary Examiner* — Luan C Thai
(74) *Attorney, Agent, or Firm* — Schwabe, Williamson & Wyatt, P.C.

(57) ABSTRACT

Embodiments of the invention include an electrical package and methods of forming the package. In one embodiment, the electrical package may include a first package layer. A plurality of signal lines with a first thickness may be formed on the first package layer. Additionally, a power plane with a second thickness may be formed on the first package layer. According to an embodiment, the second thickness is greater than the first thickness. Embodiments of the invention may form the power plane with a lithographic patterning and deposition process that is different than the lithographic patterning and deposition process used to form the plurality of signal lines. In an embodiment, the power plane may be formed concurrently with vias that electrically couple the signal lines to the next routing layer.

16 Claims, 8 Drawing Sheets

(51) Int. Cl.
*H01L 23/48* (2006.01)
*H01L 21/48* (2006.01)
*H01L 23/498* (2006.01)

(52) U.S. Cl.
CPC .. *H01L 23/49822* (2013.01); *H01L 23/49827* (2013.01); *H01L 23/49838* (2013.01)

(58) Field of Classification Search
USPC .......................................................... 257/775
See application file for complete search history.

(56) References Cited

U.S. PATENT DOCUMENTS

| | | | |
|---|---|---|---|
| 6,747,340 B2 * | 6/2004 | Barnes | H01L 23/5225 |
| | | | 257/659 |
| 8,736,021 B2 | 5/2014 | Chu et al. | |
| 8,786,061 B2 * | 7/2014 | Sawada | H01L 25/0657 |
| | | | 257/664 |
| 8,912,634 B2 * | 12/2014 | Danny | H01P 5/107 |
| | | | 257/664 |
| 8,941,243 B2 | 1/2015 | Shim | |
| 10,410,939 B2 * | 9/2019 | Bharath | H01L 23/48 |
| 2002/0005584 A1 | 1/2002 | Domae | |
| 2006/0081960 A1 | 4/2006 | Wu | |
| 2009/0145630 A1 | 6/2009 | Watanabe et al. | |
| 2012/0068303 A1 | 3/2012 | Chu et al. | |
| 2013/0328210 A1 | 12/2013 | Shim | |

OTHER PUBLICATIONS

International Preliminary Report on Patentability for International Patent Application No. PCT/US2015/066186 dated Jun. 28, 2018, 10 pages.

Office Action from Taiwan Patent Application No. 105135858, dated Mar. 24, 2020, 6 pgs.

* cited by examiner

PACKAGE POWER DELIVERY USING PLANE AND SHAPED VIAS

CROSS-REFERENCE TO RELATED APPLICATION

This patent application a continuation of U.S. patent application Ser. No. 15/776,755 filed May 16, 2018, which is a U.S. National Phase Application under 35 U.S.C. § 371 of International Application No. PCT/US2015/066186, filed Dec. 16, 2015, entitled "IMPROVED PACKAGE POWER DELIVERY USING PLANE AND SHAPED VIAS," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to signal lines and power planes that are formed in the same routing layer of a semiconductor package and have different thicknesses and methods for manufacturing such devices.

BACKGROUND OF THE INVENTION

The drive to reduce the overall thickness and increase the routing density in electronic packaging has necessitated that the line widths and spacing between copper lines be reduced. In order to obtain the reduced line widths and spacing, the thicknesses of the copper lines must also be reduced. A drawback to reducing the thickness of copper lines is that the path resistance ($R_{path}$) is increased. Maintaining a low $R_{path}$ is particularly important in the design of power delivery networks within the package.

Ideally, the power planes in the power delivery network are designed with a minimum resistance and inductance. These parameters may be minimized by increasing the thickness of the power plane. However, since the copper lines and the power plane are formed with the same patterning and metal deposition processes, thicker metal in the power plane requires the thickness of the copper lines used for signal routing to be increased as well. Accordingly, when a thicker power plane is used, the signal routing lines in the layer require larger minimum line widths and spacings. The increased line width and spacing affects signal routing density and therefore, requires an increase in the number of layers of the package. Increasing the number of layers increases the overall thickness of the package and increases the cost of the package.

Thus, improvements are needed in the area of electronic packaging fabrication in order to form different metal thickness within a single layer in order to provide thick metal for the power plane routing and thin metal for the signal routing.

DETAILED DESCRIPTION OF THE INVENTION

Described herein are systems that include a semiconductor package and methods of forming such semiconductor packages. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
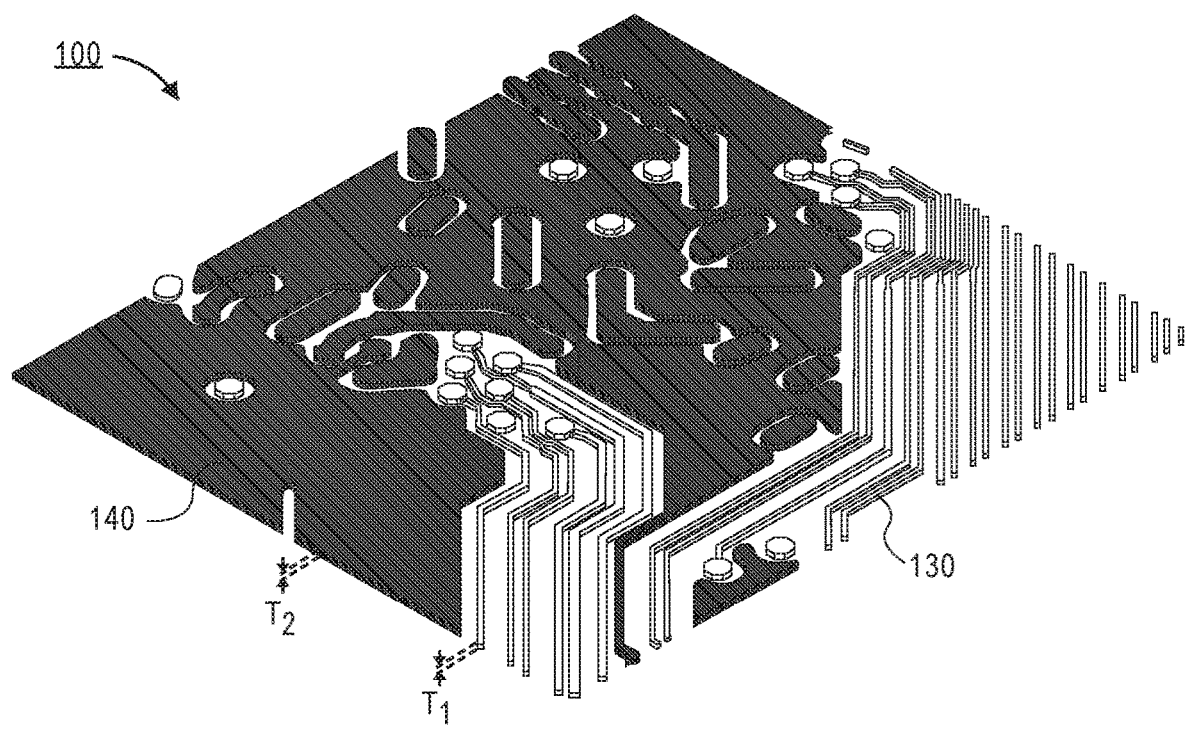
FIG. 1 is a perspective view of a package substrate that includes a power plane and signal lines that have substantially the same thickness.

As described above, in current packaging technologies the signal lines and the power plane in a routing layer are formed with the same metal deposition process. Accordingly, the thickness of the signal lines and the thickness of the power plane are the same. FIG. 1 is a perspective view of a layer in an interconnect package 100 that includes a power plane 140 and signal lines 130. The substrate on which power plane 140 and the signal lines 130 are formed is omitted for simplicity. As illustrated, the signal lines 130 have a first thickness $T_1$, and the power plane 140 has a second thickness $T_2$. Since the power plane 140 and the signal lines 130 are formed with the same metal deposition processes, $T_1$ and $T_2$ are substantially equal to each other. Accordingly, the design of the package 100 must include trade-offs between routing density of the signal lines 130 and path resistance $R_{path}$ in the power plane 140.

Figure 2:
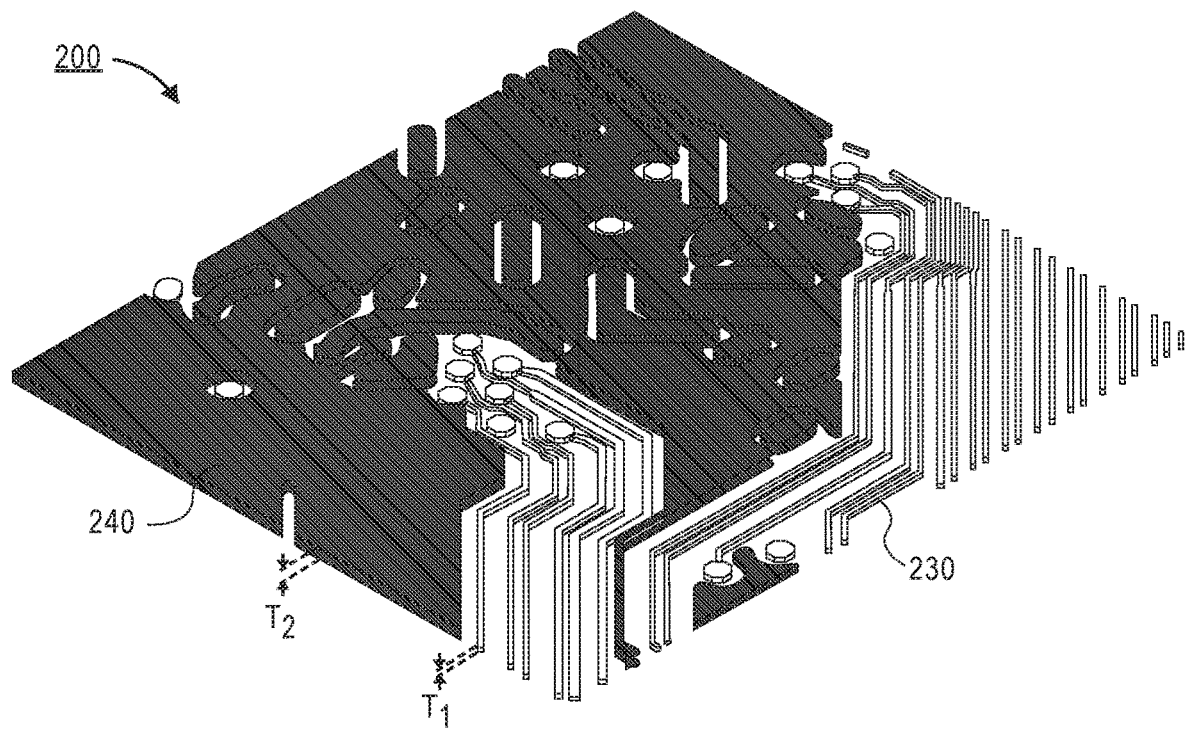
FIG. 2 is a perspective view of a package substrate that includes signal lines that have a first thickness that is less than a second thickness of the power plane, according to an embodiment of the invention.

In contrast, embodiments of the present invention decouple the thicknesses of the signal lines and the power plane. Accordingly, the thickness of the power plane may be larger than the thickness of the signal lines. FIG. 2 is a perspective view of a layer in a package 200 according to such an embodiment. In the illustrated embodiment, the thickness $T_2$ of the power plane 240 is greater than the thickness $T_1$ of the signal lines 230. The ability to vary the thickness of different conductive features within a single layer allows for critical parameters of both types of features to be optimized. For example, increasing the thickness $T_2$ of the power plane 240 allows for the $R_{path}$ of the power plane 240 to be minimized while still allowing for fine line and space design rules for the signal lines 230.

Embodiments of the invention include processes for decoupling the thicknesses of the power plane and the signal lines without requiring additional processing operations (e.g., extra exposure masks and deposition processes may not be needed). Instead of requiring a patterning and deposition process that only forms the power plane, embodiments of the invention include processing operations that allow for the vias to be formed concurrently with the formation of the power plane. Accordingly, processing operations that are already needed to form the vias may also be used to form a power plane.

Embodiments of the invention are able to utilize the via formation process operations to also form the power plane, because the vias are formed with a lithographic patterning operation instead of a laser drilling process that is used in current packaging technologies. Since the via openings are defined with a lithographic process, the lithographic mask can be altered to also include the openings for the power plane. In addition to using the lithographic patterning process to combine the formation of the power plane and the vias, the lithographic patterning process allows for a reduction in the line width and spacing of the signal lines. Laser drilling is limited by the minimum feature size and the misalignment of the laser when drilling the via opening. For example, the minimum feature size of a laser drilled via opening may be approximately 40 µm or larger when a $CO_2$ laser is used, and the misalignment between the layers may be approximately +/−15 µm or larger. As such, the via pad sizes may need to be approximately 70 µm (i.e., 40+2(15) µm) or larger. Accordingly, the use of lithographically patterned via openings allows for smaller minimum feature sizes and reductions in misalignment. This allows for the via pads to be smaller, thereby increasing the routing density.

A process that enables the thicknesses of the power plane and the signal lines to be decoupled from each other is described with respect to FIGS. 3A-3F. The improved patterning and deposition processes, such as the ones described herein, allow for the signal lines to have a first thickness that is smaller than a second thickness of the power plane. As such, embodiments of the invention provide a package that is optimized to have a power plane with a low $R_{path}$ and signal lines with reduced line width and spacing requirements.

Figure 3A:
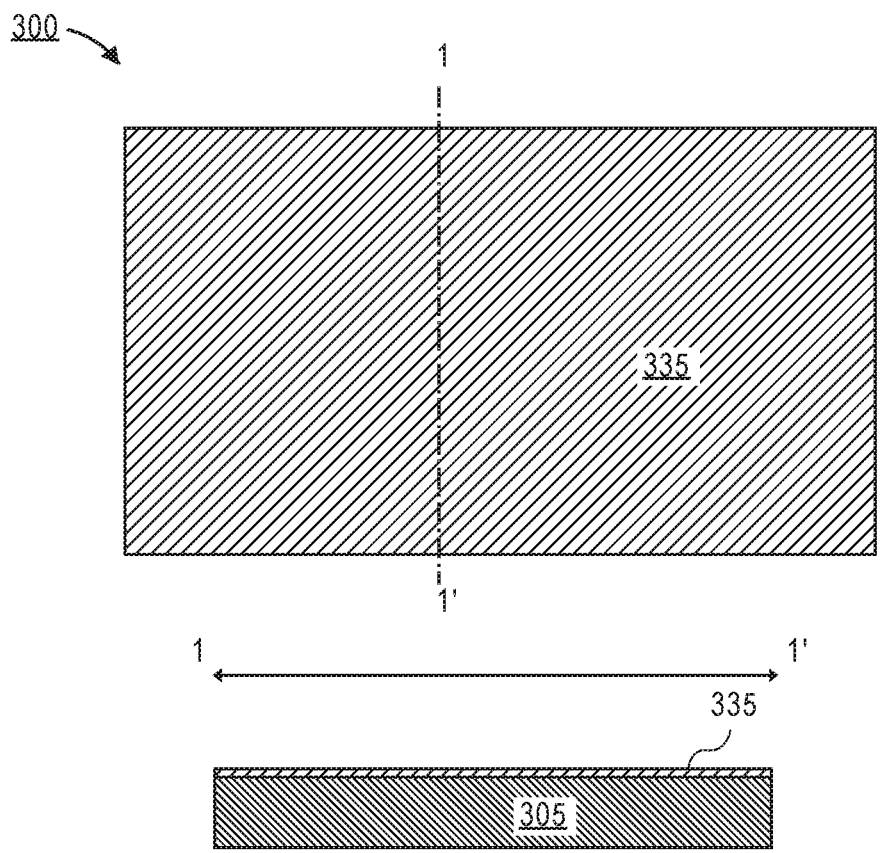
FIG. 3A is a plan view and a corresponding cross-sectional illustration of a package substrate with a dielectric layer that has a seed layer formed over the surface, according to an embodiment of the invention.

Referring now to FIG. 3A, a plan view and a corresponding cross-sectional view of a package 300 are illustrated, according to an embodiment of the invention. The package 300 may include a dielectric layer 305 that has a seed layer 335 formed over the top surface. By way of example, the dielectric layer 305 may be a polymer material, such as, for example, polyimide, epoxy, or build-up film (BF). In an embodiment, the dielectric layer 305 may be one layer in a stack that includes a plurality of dielectric layers used to form a build-up structure. As such, the dielectric layer 305 may be formed over another dielectric layer. Additional embodiments may include forming the dielectric layer 305 as the first dielectric layer over a core material on which the stack is formed. In an embodiment, the seed layer 335 may be a copper seed layer. According to an additional embodiment, the substrate 305 may be the bottommost layer of a package, and be a metallic material. In such embodiments, the seed layer 335 may be omitted.

Figure 3B:
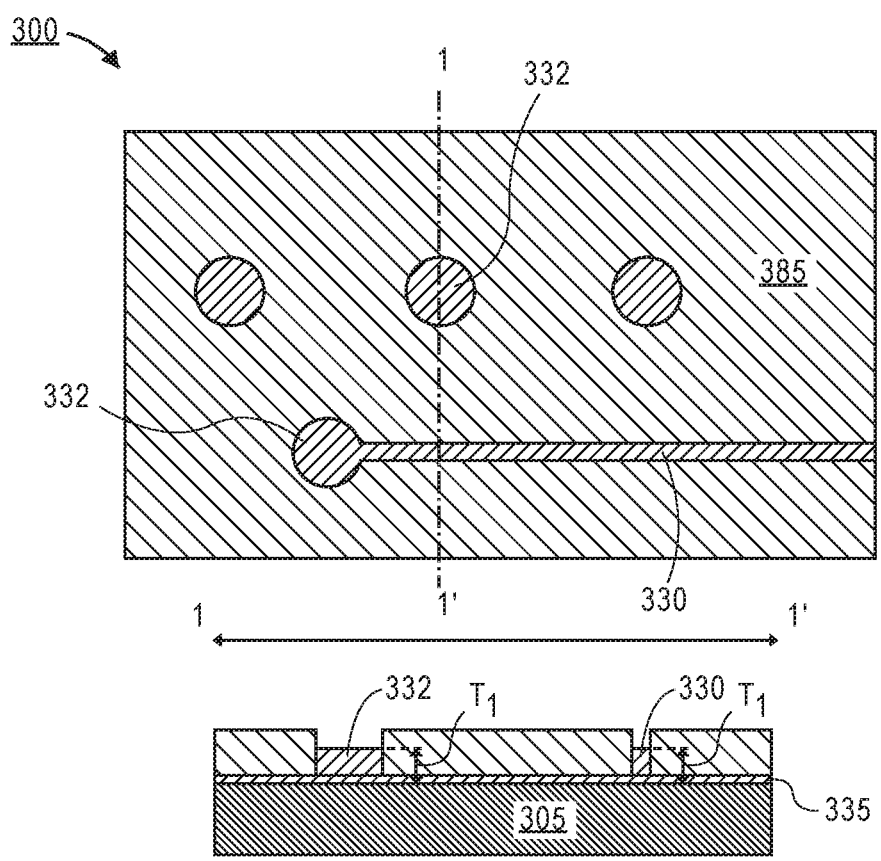
FIG. 3B is a plan view and a corresponding cross-sectional illustration of the package substrate after signal lines and via pads are formed over a surface of the substrate, according to an embodiment of the invention.

Referring now to FIG. 3B, a photoresist material 385 may be formed over the seed layer 335 and patterned to provide openings for the formation of one or more signal lines 330 and via pads 332. According to an embodiment, the patterning of the photoresist material 385 may be implemented with lithographic processes (e.g., exposed with a radiation source through a mask (not shown) and developed with a developer). After the photoresist material 385 has been patterned, the signal lines 330 and the via pads 332 may be formed. In an embodiment, the signal lines 330 and the via pads 332 may be formed with an electroplating process or the like.

As illustrated, the signal lines 330 and the via pads 332 may be formed to a first thickness $T_1$. The thickness $T_1$ of the signal lines 330 and the via pads 332 may be a thickness that allows for the desired line width and spacing between neighboring lines. It is to be appreciated that neighboring signal lines 330 are not illustrated in the Figures in order to not unnecessarily obscure embodiments of the invention. Embodiments of the invention include a first thickness $T_1$ for the signal lines 330 and via pads 332 that is less than a second thickness $T_2$ of a subsequently formed power plane. For example, the thickness $T_1$ may be approximately 20 µm or less. In a particular embodiment, the thickness $T_1$ may be approximately 10 µm or less. Since lithographically defined via openings may be used according to embodiments of the invention, the diameter of the via pads 332 may be smaller than would otherwise be needed when the via openings are formed with a laser drilling process. When the use of via pads 332 that can be formed with a reduced diameter are combined with thin metal thicknesses $T_1$, embodiments of the invention allow for an increased routing density.

Figure 3C:
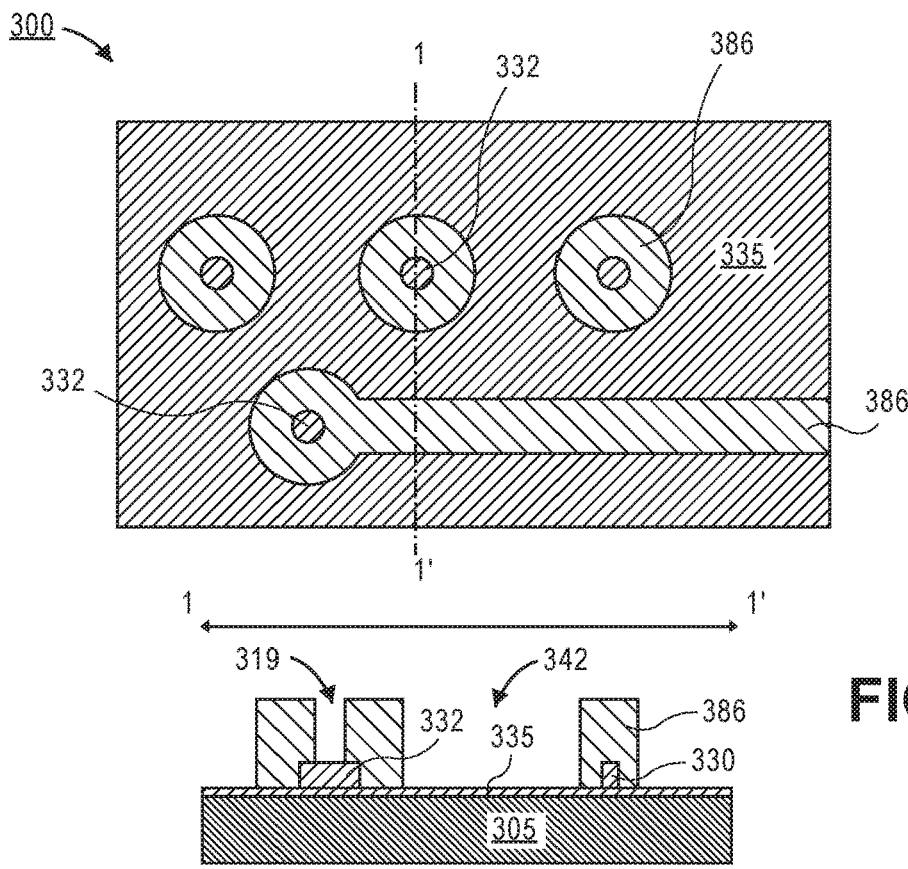
FIG. 3C is a plan view and a corresponding cross-sectional illustration of the package substrate after a second photoresist material has been deposited and patterned to form via openings and power plane openings, according to an embodiment of the invention.

Referring now to FIG. 3C, the first photoresist material 385 is stripped, and a second photoresist material 386 is deposited over the signal lines 330 and the via pads 332. Via openings 319 and power plane openings 342 may then be patterned into the second photoresist material 386 by exposing the second photoresist material 386 to radiation through a mask (not shown) and developing with a developer. Patterning the second photoresist material 386 exposes the seed layer 335 in portions of the package substrate 300 and also exposes a portion of the via pads 332.

Figure 3D:
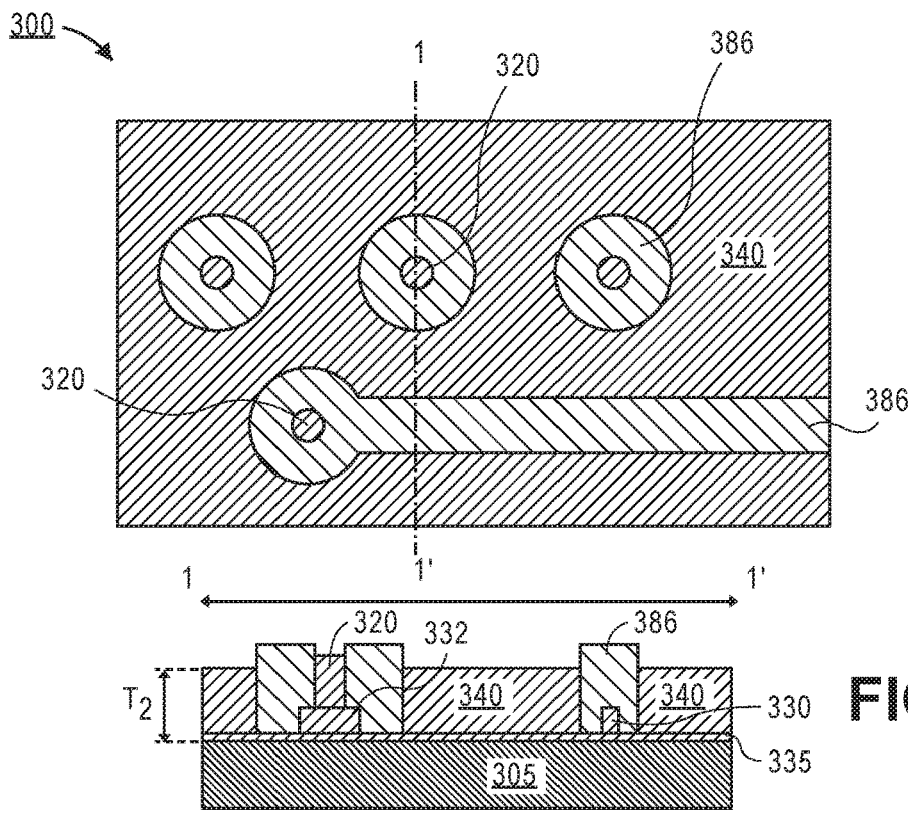
FIG. 3D is a plan view and a corresponding cross-sectional illustration of the package substrate after the vias and the power plane are formed in the openings in the second photoresist material, according to an embodiment of the invention.

Referring now to FIG. 3D, a second metal deposition process is used to deposit a conductive material to form the vias 320 and the power plane 340. According to an embodiment, the deposition process may be any suitable deposition process, such as electroplating or the like. As illustrated, the power plane 340 may be formed to a second thickness $T_2$ that is different than the first thickness $T_1$ since the signal lines 330 are protected from further deposition by the second photoresist material 386. According to an embodiment, the second thickness $T_2$ may be any desired thickness to provide a desired $R_{path}$ for the power plane. For example, when the thickness $T_2$ is doubled the path resistance $R_{path}$ is reduced in half. In an embodiment, the thickness $T_2$ may be approximately 10 μm or greater. In one embodiment, the thickness $T_2$ may be approximately 20 μm or greater. Additional embodiments may also include a second thickness $T_2$ that is up to or greater than the thickness of the dielectric layer formed over the signal lines 330 in a subsequent processing operation. In such an embodiment, the power plane 340 may be formed through two or more routing layers by repeating the process described herein for each layer. While the power plane 340 illustrated in FIG. 3D is a single continuous pad, it is to be appreciated that the second photoresist material 386 may be patterned to include a plurality of power plane pads, similar to the power plane 240 illustrated in FIG. 2.

The vias 320 provide a conductive path from the signal lines 330 that allows the signal lines 330 to be electrically coupled to a subsequently formed layer in the package 300. While the vias 320 are illustrated as being substantially circular and located only over the via pads 332, it is to be appreciated that the shape of the vias 320 are not limited to such configurations. For example, the vias may be elongated (i.e., line vias) that extend along portions of (or the entire length of) the signal lines 330. Additionally, since the vias 320 are being deposited over the via pads 332, they may include a top surface that is higher than the top surface of the power plane 340.

Figure 3E:
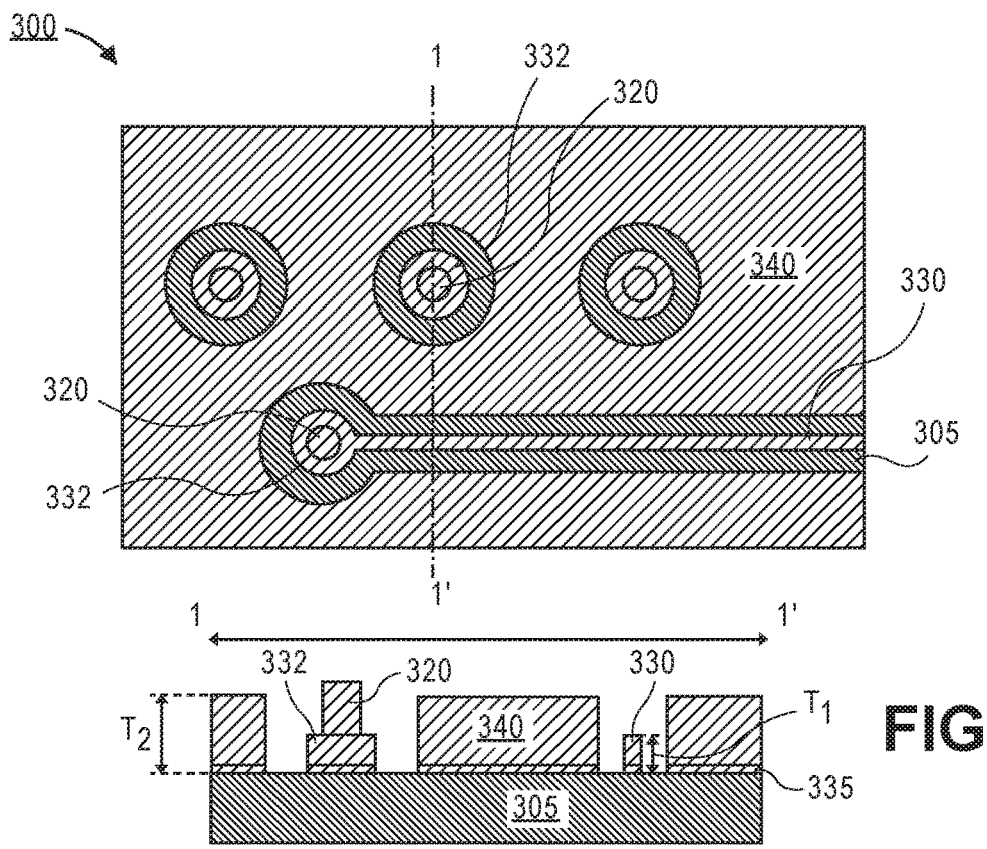
FIG. 3E is a plan view and a corresponding cross-sectional illustration of the package after the second photoresist material and the exposed portions of the seed layer have been removed, according to an embodiment of the invention.

Referring now to FIG. 3E, the second photoresist material 386 is stripped and the exposed portions of the seed layer 335 are removed. According to an embodiment, the seed layer 335 may be removed with a seed etching process. After the seed layer 335 is removed, the power plane 340 is electrically isolated from the signal lines 330 and the via pads 332.

Figure 3F:
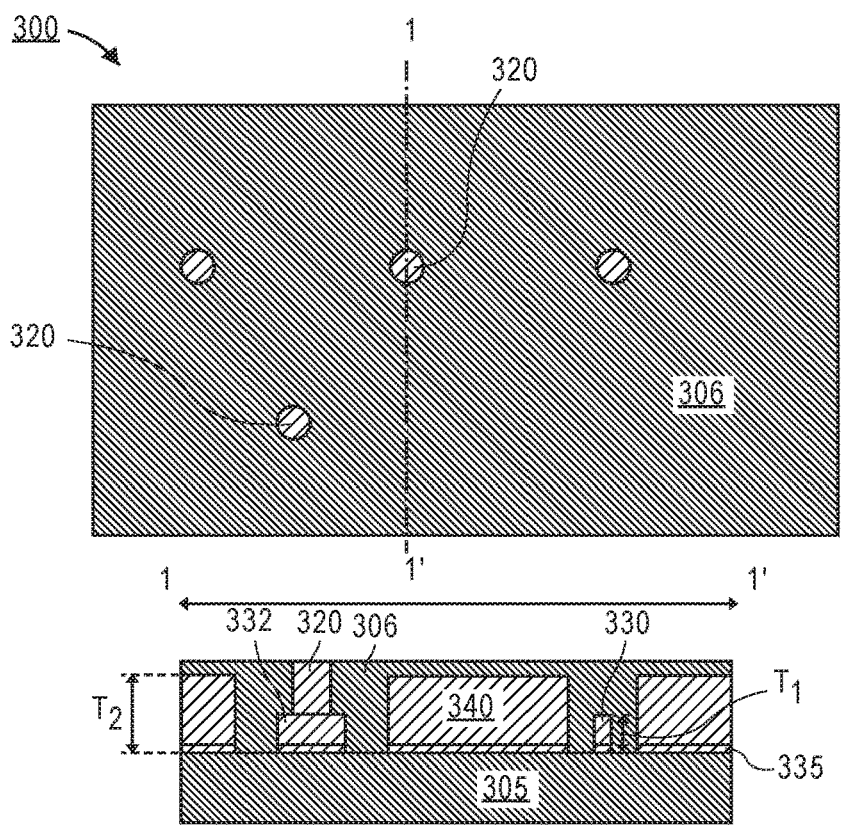
FIG. 3F is a plan view and a corresponding cross-sectional illustration of the package after a second dielectric layer has been formed over the surface, according to an embodiment of the invention.

Referring now to FIG. 3F, a second dielectric layer 306 is formed over the exposed power plane 340, vias 320, signal lines 330, and via pads 332. According to an embodiment the second dielectric layer 306 may be formed with any suitable process, such as lamination or slit coating and curing. In an embodiment, the second dielectric layer 306 is formed to a thickness that will completely cover a top surface of the vias 320. As opposed to layer formation on crystalline structures (e.g., silicon substrates), each of the dielectric layers may not be highly uniform. Accordingly, the second dielectric layer 306 may be formed to a thickness that is greater than the combined height of the vias 320 and the via pads 332 to ensure that the proper thickness is reached across the entire substrate. When the second dielectric is formed above the vias 320, a controlled etching process may then be used to expose the top surface of the vias 320, as illustrated in FIG. 3F.

In an embodiment, the dielectric removal process may include a wet etch, a dry etch (e.g., a plasma etch), a wet blast, or a laser ablation (e.g., by using excimer laser). According to an additional embodiment, the depth controlled dielectric removal process may be performed only proximate to the vias 320. For example, laser ablation of the second dielectric layer 306 may be localized proximate to the location of the via 320. In some embodiments, the thickness of the second dielectric layer 306 may be minimized in order to reduce the etching time required to expose the line via 320. In other embodiments, when the thickness of the dielectric can be well controlled, the vias 320 may extend above the top surface of the second dielectric layer 306 and the controlled dielectric removal process may be omitted.

Furthermore, it is to be appreciated that the top surface of the power plane 340 is covered by the second dielectric layer 306 in some embodiments. As such, the subsequently formed signal lines on the next layer may be formed directly above portions of the power plane 340. In additional embodiments where the power plane 340 is extended into the next routing layer, the second dielectric layer 306 may be recessed to expose a top portion of the power plane 340 in addition to exposing a top portion of the vias 320.

According to an embodiment of the invention, alternative processes may also be used for forming a power plane with a thickness that is greater than the thickness of the signal lines. Instead forming the power plane and the vias prior to depositing the second dielectric layer, embodiments of the invention may also utilize a process where the second dielectric layer is deposited prior to forming the power plane and the vias. Such an embodiment is described in detail with respect to FIGS. 4A-4F.

Figure 4A:
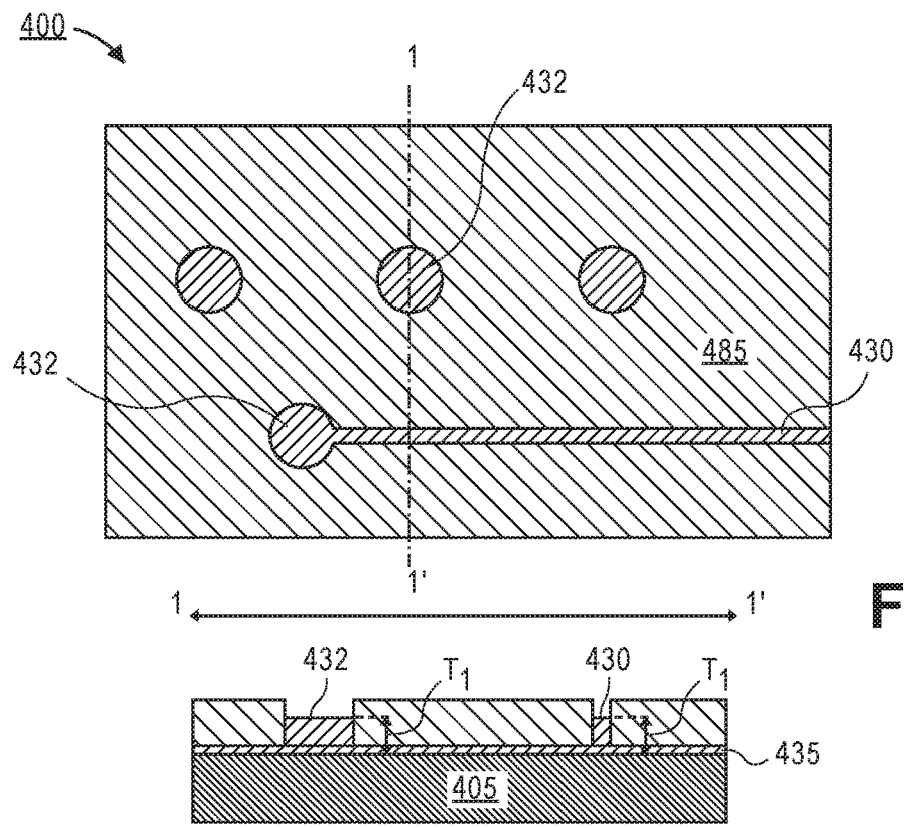
FIG. 4A is a plan view and a corresponding cross-sectional illustration of a package substrate after signal lines and via pads are formed over a surface of the substrate, according to an embodiment of the invention

Referring now to FIG. 4A, a plan view and a corresponding cross-sectional view of a package 400 are illustrated, according to an embodiment of the invention. The package 400 may include a dielectric layer 405 that has a seed layer 435 formed over the top surface. According to an embodiment, the seed layer 435 and the dielectric layer 405 may be substantially similar to the seed layer 335 and dielectric layer 305 described above.

In FIG. 4A a photoresist material 485 is formed over the seed layer 435 and patterned to provide openings for the formation of one or more signal lines 430 and via pads 432. According to an embodiment, the patterning of the photoresist material 485 may be implemented with lithographic processes (e.g., exposed with a radiation source through a mask (not shown) and developed with a developer). After the photoresist material 485 has been patterned, the signal lines 430 and the via pads 432 may be formed. In an embodiment, the signal lines 430 and the via pads 432 may be formed with an electroplating process or the like.

As illustrated, the signal lines 430 and the via pads 432 may be formed to a first thickness $T_1$. The thickness $T_1$ of the signal lines 430 and the via pads 432 may be a thickness that allows for the desired line width and spacing between neighboring lines. It is to be appreciated that neighboring signal lines 430 are not illustrated in the Figures in order to not unnecessarily obscure embodiments of the invention. Embodiments of the invention include a first thickness $T_1$ for the signal lines 430 and via pads 432 that is less than a second thickness $T_2$ of a subsequently formed power plane. For example, the thickness $T_1$ may be approximately 20 μm or less. In a particular embodiment, the thickness $T_1$ may be approximately 10 μm or less. Since lithographically defined via openings may be used according to embodiments of the invention, the diameter of the via pads 432 may be smaller than would otherwise be needed when the via openings are formed with a laser drilling process. When the use of via pads 432 that can be formed with a reduced diameter are combined with thin metal thicknesses $T_1$, embodiments of the invention allow for an increased routing density.

Figure 4B:
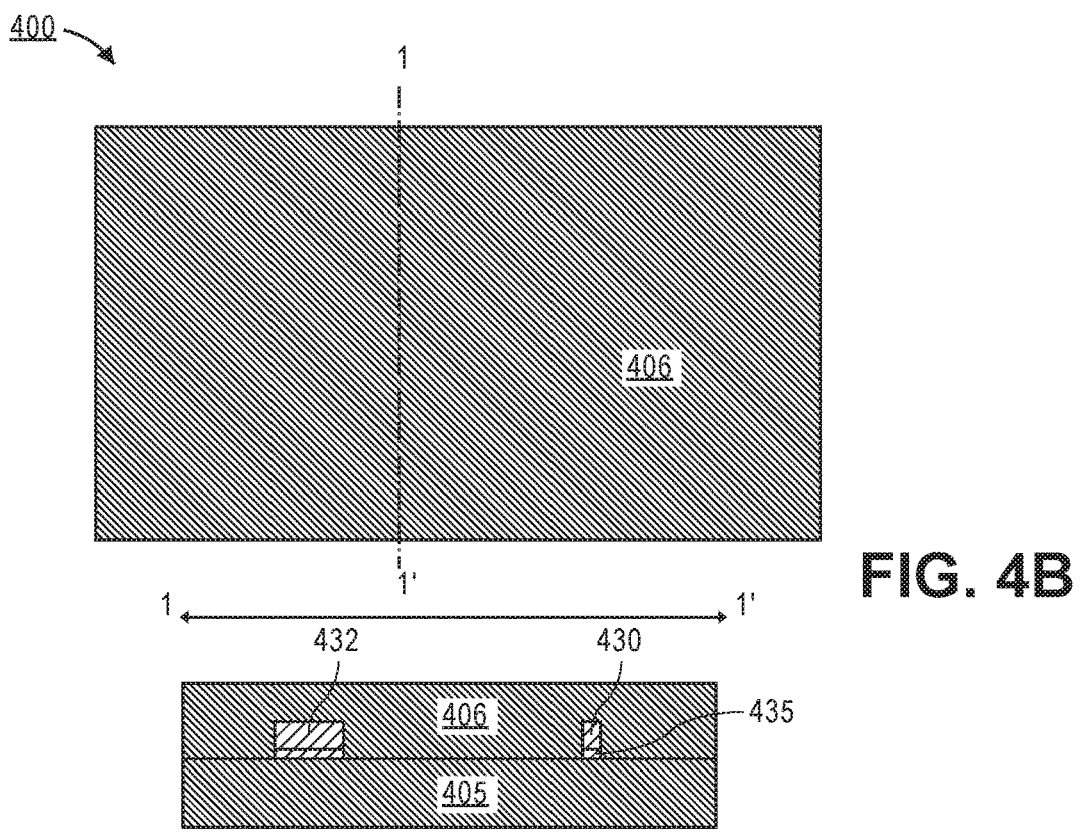
FIG. 4B is a plan view and a corresponding cross-sectional illustration of the package substrate after a second dielectric layer is formed over the signal lines and via pads, according to an embodiment of the invention.

Referring now to FIG. 4B, the first photoresist material 485 is stripped a second dielectric layer 406 is formed over the signal lines 430 and via pads 432. In some embodiments, the portions of the seed layer 435 that were covered by the first photoresist material 485 may also be removed prior to forming the second dielectric layer 406. The seed layer 435 may be removed with a seed etching process. According to an embodiment, the second dielectric layer 406 may be formed with any suitable process, such as lamination or slit coating and curing.

Figure 4C:
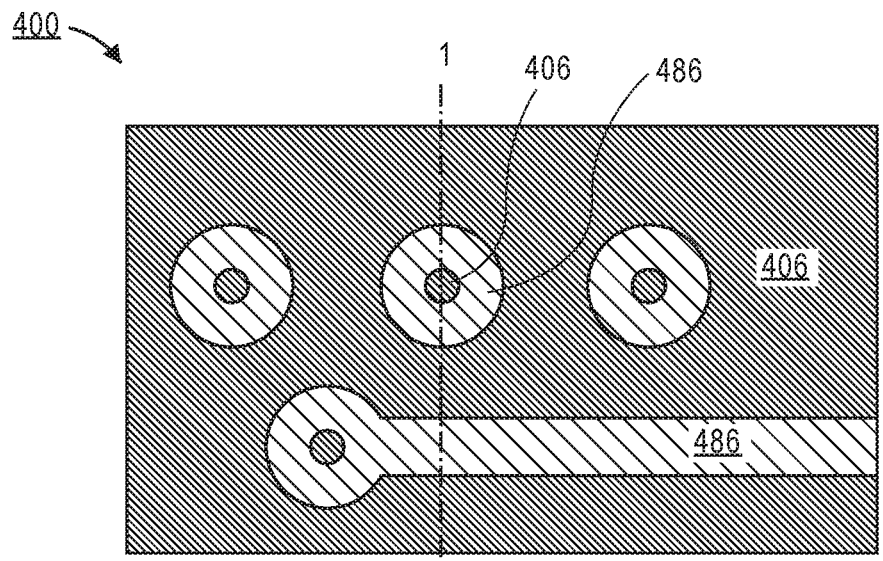
FIG. 4C is a plan view and a corresponding cross-sectional illustration of the package substrate after a second photoresist material has been deposited and patterned to form via openings and power plane openings, according to an embodiment of the invention.

Referring now to FIG. 4C, embodiments of the invention include depositing a second photoresist material 486 over the second dielectric layer 406. According to an embodiment, the second photoresist material 486 may then be patterned to form via openings 419 and power plane openings 442. In some embodiments, the second photoresist material 486 may be opaque. In such embodiments, an alignment mark (not shown) below the second photoresist material 486 may be revealed with a laser drilling process. After the alignment mark is revealed, a mask (not shown) may be aligned with the alignment mark and used to pattern the via openings 419 and the power plane openings 442 into the second photoresist material 486.

Figure 4D:
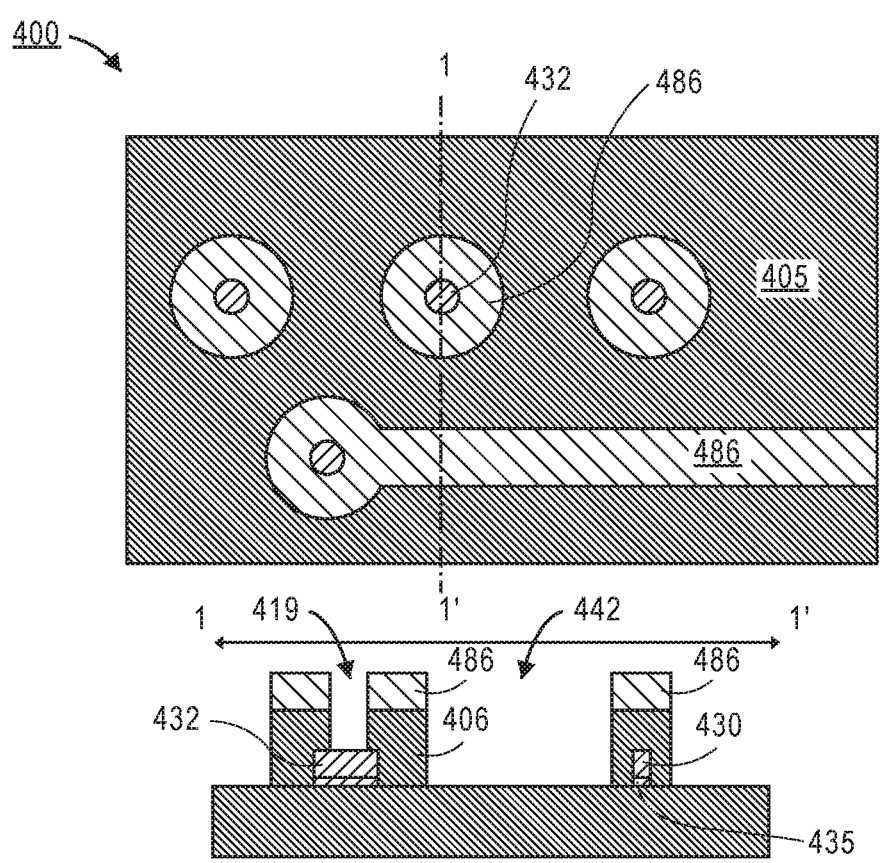
FIG. 4D is a plan view and a corresponding cross-sectional illustration of the package substrate after the via openings and the power plane openings are transferred into the second dielectric layer, according to an embodiment of the invention.

Referring now to FIG. 4D, the second dielectric layer 406 is patterned using the second photoresist material 486 as a mask in order to transfer the via openings 419 and the power plane openings 442 into the second dielectric layer 406. Embodiments of the invention include an anisotropic etching process that provides substantially vertical sidewalls for the openings in the second dielectric layer 406. For example, the second dielectric layer 406 may be etched with a dry etching process, such as a plasma etch. The dry etching process may also etch the second photoresist material 486. Accordingly, embodiments of the invention include a second photoresist material 486 that has a thickness that allows for a portion to be removed while still maintaining an etch mask for the second dielectric layer 406. Alternative embodiments may also include a hardmask layer (not shown) formed between the second photoresist material 486 and the second dielectric layer 406. In such an embodiment, the via openings and the power plane openings may be patterned into the hardmask layer, which can then be used as a mask for etching the pattern into the second dielectric layer. As such, the photoresist material 486 does not have to have a high etch selectivity with respect to the second dielectric layer 406.

Figure 4E:
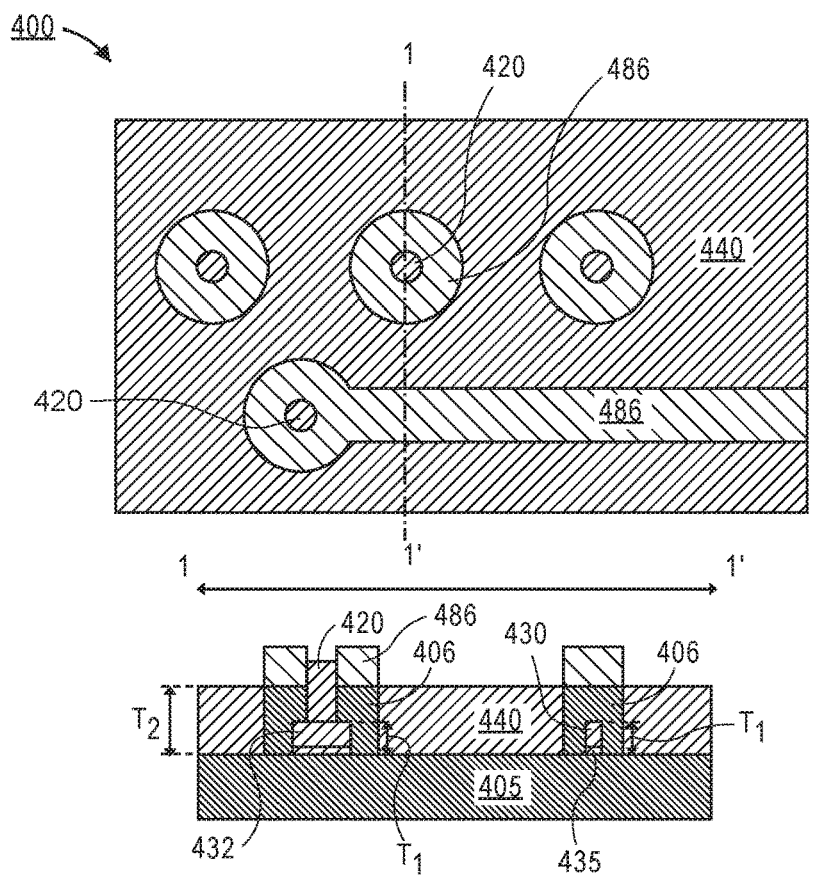
FIG. 4E is a plan view and a corresponding cross-sectional illustration of the package after the vias and the power plane are formed in the openings in the second dielectric layer, according to an embodiment of the invention.

Referring now to FIG. 4E, the power plane 440 and the vias 420 may be formed in the openings formed in the second dielectric layer 406. In an embodiment, a seed layer (not shown) may be formed first, followed by a metal deposition process. For example, the metal deposition process may be an electroplating process or the like. As illustrated, the power plane 440 may be formed to a second thickness $T_2$ that is different than the first thickness $T_1$ since the signal lines 430 are protected from further deposition by the second dielectric layer 406. According to an embodiment, the second thickness $T_2$ may be any desired thickness to provide a desired $R_{path}$ for the power plane. In an embodiment, the thickness $T_2$ may be approximately 10 μm or greater. In one embodiment, the thickness $T_2$ may be approximately 20 μm or greater. Additional embodiments may also include a second thickness $T_2$ that is up to or greater than the thickness of the second dielectric layer 406 formed over the signal lines 430. In such an embodiment, the power plane 440 may be formed through two or more routing layers by repeating the process described herein for each layer. While the power plane 440 illustrated in FIG. 4D is a single continuous pad, it is to be appreciated that the second dielectric layer 406 may be patterned to include a plurality of power plane pads, similar to the power plane 240 illustrated in FIG. 2.

The vias 420 provide a conductive path from the signal lines 430 that allows the signal lines 430 to be electrically coupled to a subsequently formed layer in the package 400. While the vias 420 are illustrated as being substantially circular and located only over the via pads 432, it is to be appreciated that the shape of the vias 420 are not limited to such configurations. For example, the vias may be elongated (i.e., line vias) that extend along portions of (or the entire length of) the signal lines 430. Additionally, since the vias 420 are being deposited over the via pads 432, they will include a top surface that is higher than the top surface of the power plane 440.

Figure 4F:
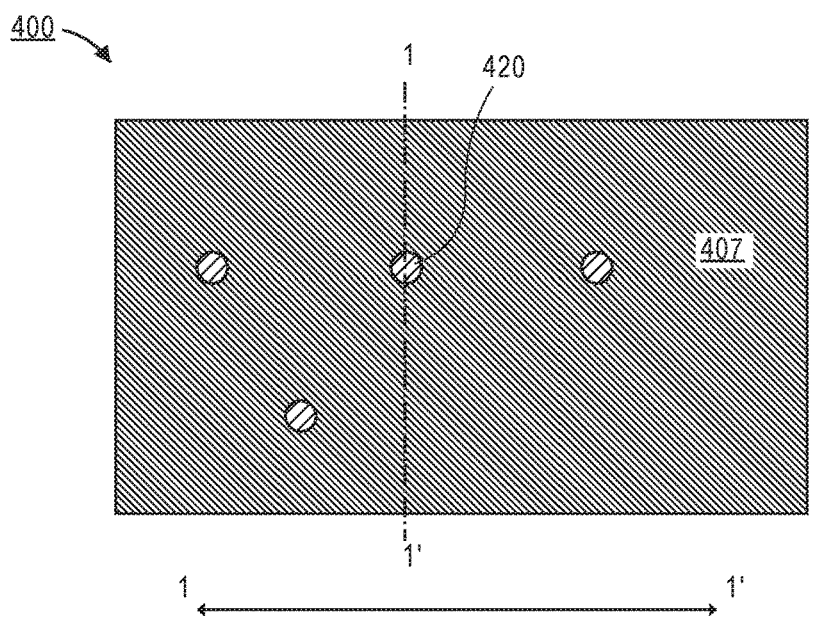
FIG. 4F is a plan view and a corresponding cross-sectional illustration of the package after a third dielectric layer has been formed over the surface, according to an embodiment of the invention.

Referring now to FIG. 4F, the remaining photoresist material 486 may be stripped and a third dielectric layer 407 may be formed over the top surfaces of the power plane 440. According to an embodiment, the third dielectric layer 407 may be formed with any suitable process, such as lamination or slit coating and curing. In an embodiment, the third dielectric layer 407 is formed to a thickness that will completely cover a top surface of the vias 420. As opposed to layer formation on crystalline structures (e.g., silicon substrates), each of the dielectric layers may not be highly uniform. Accordingly, the third dielectric layer 407 may be formed to a thickness that is greater than the combined height of the vias 420 and the via pads 432 to ensure that the proper thickness is reached across the entire substrate. When the third dielectric layer 407 is formed above the vias 420, a controlled etching process may then be used to expose the top surface of the vias 420, as illustrated in FIG. 4F.

In an embodiment, the dielectric removal process may include a wet etch, a dry etch (e.g., a plasma etch), a wet blast, or a laser ablation (e.g., by using excimer laser). According to an additional embodiment, the depth controlled dielectric removal process may be performed only proximate to the vias 420. For example, laser ablation of the third dielectric layer 407 may be localized proximate to the location of the via 420. In some embodiments, the thickness of the third dielectric layer 407 may be minimized in order to reduce the etching time required to expose the line via 420. In other embodiments, when the thickness of the dielectric can be well controlled, the vias 420 may extend above the top surface of the third dielectric layer 407 and the controlled dielectric removal process may be omitted.

Furthermore, it is to be appreciated that the top surface of the power plane 440 is covered by the third dielectric layer 407 in some embodiments. As such, the subsequently formed signal lines on the next layer may be formed directly above portions of the power plane 440. In additional embodiments where the power plane 440 is extended into the next routing layer, the third dielectric layer 407 may be omitted and the next routing layer may be formed over the second dielectric layer 406.

Figure 5:
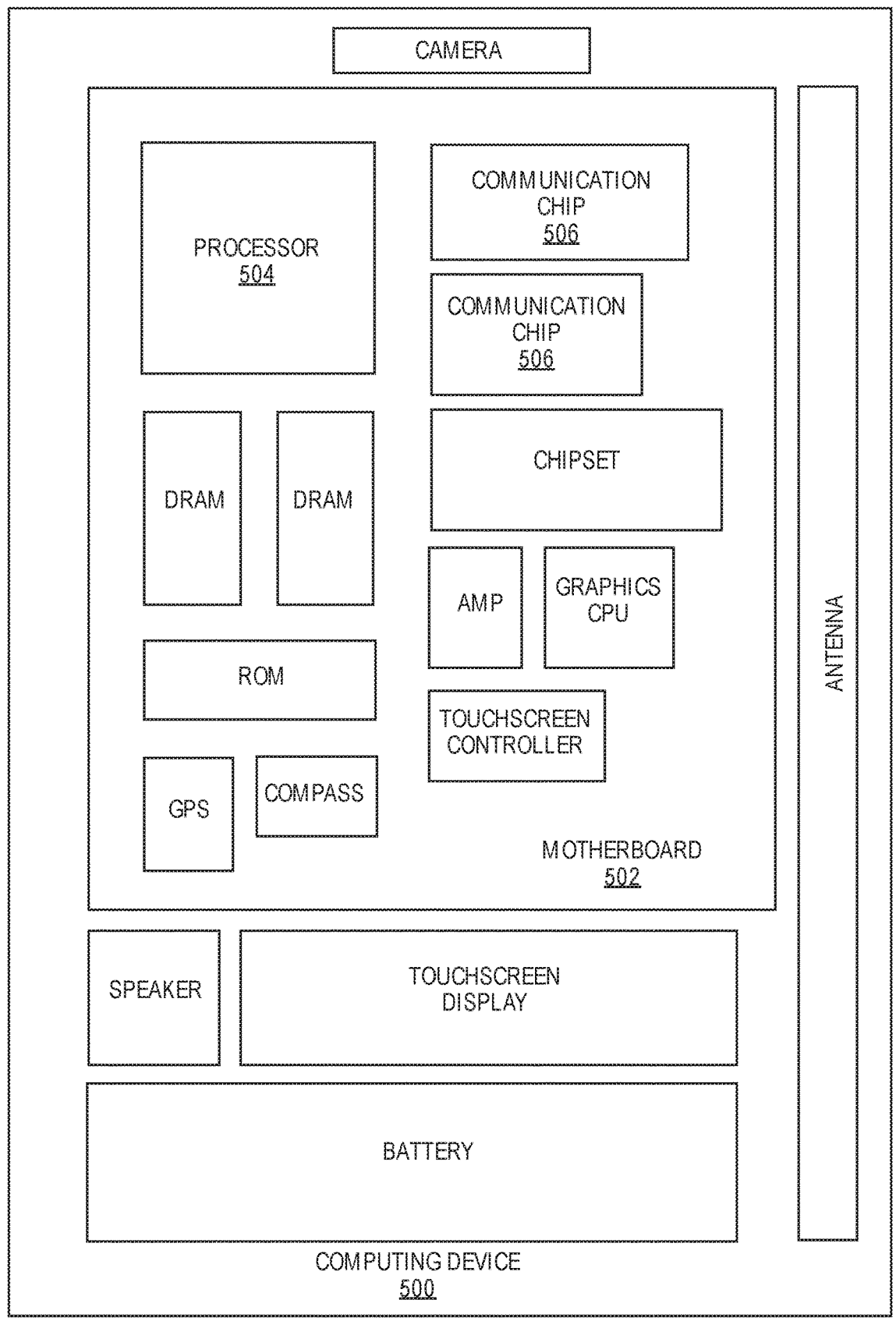
FIG. 5 is a schematic of a computing device built in accordance with an embodiment of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as devices that include signal lines and power planes that are formed in the same routing layer of a semiconductor package and have different thicknesses, in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as devices that include signal lines and power planes that are formed in the same routing layer of a semiconductor package and have different thicknesses, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include an electrical package comprising: a first package layer; a plurality of signal lines with a first thickness formed on the first package layer; and a power plane with a second thickness formed on the first package layer, wherein the second thickness is greater than the first thickness.

Additional embodiments of the invention include an electrical package, further comprising: a dielectric layer formed over the plurality of signal lines and the power plane.

Additional embodiments of the invention include an electrical package, further comprising: one or more vias electrically coupled to one or more of the signal lines, wherein the one or more vias extend through the dielectric layer.

Additional embodiments of the invention include an electrical package, wherein the vias are electrically coupled to signal lines by a via pad formed on the first package layer.

Additional embodiments of the invention include an electrical package, wherein top surfaces of the one or more vias is above a top surface of the power plane.

Additional embodiments of the invention include an electrical package, wherein the power plane extends above the first dielectric layer.

Additional embodiments of the invention include an electrical package, wherein the first thickness is approximately 10 μm or less and the second thickness is greater than approximately 10 μm.

Additional embodiments of the invention include an electrical package, wherein a minimum spacing between signal lines is less than a minimum spacing between the power plane and any of the signal lines.

Embodiments of the invention include a method of forming an electrical package, comprising: forming a plurality of signal lines with a first thickness over a first package substrate; depositing a photoresist layer over the first package substrate and the plurality of signal lines; patterning the photoresist layer to form a power plane opening through the photoresist layer, wherein the photoresist layer remains over the plurality of signal lines; depositing a conductive material into the power plane opening to form a power plane on the first package substrate, wherein the power plane has a second thickness that is greater than the first thickness; removing the photoresist layer; and forming a second dielectric layer over the first package substrate, the power plane, and the plurality of signal lines.

Additional embodiments of the invention include a method of forming an electrical package, wherein a conductive seed layer is formed over a top surface of the first package substrate.

Additional embodiments of the invention include a method of forming an electrical package, further comprising: removing portions of the seed layer that are not covered by the power plane or the plurality of signal lines after the photoresist material is removed.

Additional embodiments of the invention include a method of forming an electrical package, further comprising forming one or more via pads over the first package substrate that are each electrically coupled to one of the signal lines prior to depositing the photoresist layer.

Additional embodiments of the invention include a method of forming an electrical package, further comprising: forming via openings through the photoresist layer with the same processes used to form the power plane openings; and forming vias in the via openings with the same processes used to form the power plane.

Additional embodiments of the invention include a method of forming an electrical package, wherein the second dielectric layer is formed over above a top surface of the vias.

Additional embodiments of the invention include a method of forming an electrical package, further comprising: recessing the second dielectric layer to expose the top surface of the vias, wherein the second dielectric lay remains over a top surface of the power plane.

Additional embodiments of the invention include a method of forming an electrical package, wherein the first thickness is approximately 10 µm or less and the second thickness is greater than 10 µm.

Embodiments of the invention include a method of forming an electronic package, comprising: forming a plurality of signal lines with a first thickness over a first package substrate; depositing a dielectric layer over the first package substrate and the plurality of signal lines; depositing a photoresist layer over the dielectric layer; patterning the photoresist layer to form a power plane opening through the photoresist layer and the dielectric layer, wherein the dielectric layer remains over the plurality of signal lines; depositing a conductive material into the power plane opening to form a power plane on the first package substrate, wherein the power plane has a second thickness that is greater than the first thickness; and removing the photoresist layer.

Additional embodiments of the invention include a method of forming an electrical package, further comprising forming one or more via pads over the first package substrate that are each electrically coupled to one of the signal lines prior to depositing the dielectric layer.

Additional embodiments of the invention include a method of forming an electrical package, further comprising: forming via openings through the photoresist layer and the dielectric layer with the same processes used to form the power plane openings; and forming vias in the via openings with the same processes used to form the power plane.

Additional embodiments of the invention include a method of forming an electrical package, further comprising: forming a second dielectric layer over the dielectric layer, the power plane, and the vias; and recessing the second dielectric layer to expose a top surface of the vias.

Additional embodiments of the invention include a method of forming an electrical package, wherein the first thickness is approximately 10 µm or less and the second thickness is greater than 10 µm.

Additional embodiments of the invention include a method of forming an electrical package, further comprising: forming a hardmask layer between the photoresist material and the dielectric layer; and patterning the photoresist layer further includes forming a power plane opening through the hardmask layer.

Embodiments of the invention include an electrical package comprising: a first package layer; a plurality of signal lines with a first thickness formed on the first package layer; a plurality of via pads each coupled to one of the signal lines; a power plane with a second thickness formed on the first package layer, wherein the second thickness is greater than the first thickness; a dielectric layer formed over the first package layer; and a plurality of vias formed through the dielectric layer and in contact with one of the via pads.

Additional embodiments of the invention include an electrical package, wherein the first thickness is approximately 10 µm or less and the second thickness is greater than approximately 10 µm.

Additional embodiments of the invention include an electrical package, wherein the dielectric layer covers a top surface of the power plane.

What is claimed is:

1. An electrical package comprising:
a first package layer;
a plurality of signal lines with a first thickness formed on the first package layer; and
a power plane with a second thickness formed on the first package layer, wherein the second thickness is greater than the first thickness, and wherein the power plane surrounds one or more of the plurality of signal lines, and wherein a bottom surface of the power plane is substantially coplanar with bottom surfaces of the plurality of signal lines.

2. The electrical package of claim 1, further comprising:
a dielectric layer formed over the plurality of signal lines and the power plane.

3. The electrical package of claim 2, further comprising:
one or more vias electrically coupled to one or more of the signal lines, wherein the one or more vias extend through the dielectric layer.

4. The electrical package of claim 3, wherein the vias are electrically coupled to signal lines by a via pad formed on the first package layer.

5. The electrical package of claim 3, wherein top surfaces of the one or more vias is above a top surface of the power plane.

6. The electrical package of claim 1, wherein the first thickness is approximately 10 µm or less and the second thickness is greater than approximately 10 µm.

7. The electrical package of claim 1, wherein a minimum spacing between signal lines is less than a minimum spacing between the power plane and any of the signal lines.

8. The electrical package of claim 1, wherein sidewalls of the power plane are substantially vertical.

9. An electrical package comprising:
a first package layer;
a plurality of signal lines with a first thickness formed on the first package layer;
a power plane with a second thickness formed on the first package layer, wherein the second thickness is greater than the first thickness, and wherein a bottom surface of the power plane is substantially coplanar with bottom surfaces of the plurality of signal lines;
a dielectric layer formed over the plurality of signal lines and the power plane; and
one or more vias electrically coupled to one or more of the signal lines, wherein the one or more vias extend through the dielectric layer.

10. The electrical package of claim 9, wherein sidewalls of the power plane are substantially vertical.

11. The electrical package of claim 9, wherein top surfaces of the one or more vias is above a top surface of the power plane.

12. The electrical package of claim 9, wherein the first thickness is approximately 10 μm or less and the second thickness is greater than approximately 10 μm.

13. The electrical package of claim 9, wherein a minimum spacing between signal lines is less than a minimum spacing between the power plane and any of the signal lines.

14. The electrical package of claim 13, wherein the power plane surrounds one or more of the plurality of signal lines.

15. The electrical package of claim 9, wherein the vias are electrically coupled to signal lines by a via pad formed on the first package layer.

16. The electrical package of claim 15, wherein a width of the via pad is greater than a width of the signal lines.

* * * * *